United States Patent [19]

Kannegundla et al.

[11] Patent Number: 5,047,660

[45] Date of Patent: Sep. 10, 1991

[54] HIGH VOLTAGE HIGH SPEED CCD CLOCK DRIVER

[75] Inventors: Ram Kannegundla, Rochester; Win-Chyi Chang, Penfield, both of N.Y.

[73] Assignee: Eastman Kodak Company, Rochester, N.Y.

[21] Appl. No.: 432,020

[22] Filed: Nov. 6, 1989

[51] Int. Cl.$^5$ .................... H03K 5/01; H03K 17/687
[52] U.S. Cl. ............................... 307/270; 307/246; 307/269; 307/480
[58] Field of Search ............... 307/270, 451, 254, 605, 307/606, 480, 269, 241, 246, 296.1; 328/55, 66

[56] References Cited

U.S. PATENT DOCUMENTS 4,424,456  1/1984  Shiraki et al. .................. 307/268
4,700,089 10/1987  Fujii et al. ....................... 307/605
4,761,565  8/1988  Kannegundla .................. 307/243
4,910,416  3/1990  Salcone ........................... 307/591

Primary Examiner—Stanley D. Miller
Assistant Examiner—Trong Phan
Attorney, Agent, or Firm—Raymond L. Owens

[57] ABSTRACT

A driver circuit, which is capable of operation in the 30 MHz frequency range and zero to +10 volts, is useful for driving charge coupled devices (CCDs). The driver circuit uses the parallel combination of an off the shelf bipolar integrated circuit capable of charging the CCD to about six volts and an off the shelf complementary field effect transistor transmission gate capable of charging the CCD to about +10 volts. The bipolar integrated circuit is capable of discharging the CCD from about +10 volts to zero volts (ground).

5 Claims, 3 Drawing Sheets

HIGH VOLTAGE HIGH SPEED CCD CLOCK DRIVER

FIELD OF THE INVENTION

This invention relates generally to driver circuits for driving heavy capacitive loads and more particularly to clock driver circuits operated at very high frequencies and driving charge coupled devices (CCD's) to relatively high voltages.

BACKGROUND OF THE INVENTION

Known CCD clock driver circuits operated at very high frequencies (e.g., 30 megahertz) tend to be restricted in the amount of voltage deliverable to a capacitive load to about six volts when available off the shelf electronic components are used. Electronic components capable of use as high frequency CCD clock drivers circuits with operating voltages in range of about ten volts can be specially designed, however, problems of high power dissipation and cost are probable. U.S. Pat. No. 4,761,565, issued Aug. 2, 1988 and having a common assignee and inventorship with the present patent application, teaches the use of off-the-shelf electronic components to implement high frequency clock driver circuits which provide the high currents needed for CCD capacitive loads, but only operate up to about six volts.

It is thus desirable to have a high frequency (in the range of 30 MHz) CCD clock driver circuit which can be formed from readily available components and which is capable of delivering between six and twelve volts.

SUMMARY OF THE INVENTION

The present invention is directed to circuitry which uses readily available components and is capable not only of operating at frequencies of 30 megahertz and higher, but also of charging/-discharging a heavy capacitive load (e.g., a CCD having a capacitance of 150 pF) to a level of ten volts or more. Thus the circuitry of the present invention can be used as a CCD clock driver which meets not only such voltage and high frequency requirements, but is also economically viable. Furthermore, the CCD driver circuit can be implemented within reasonable power dissipation limits. The circuitry comprises first and second switches each having an input coupled to an input terminal of the circuitry and each having an output coupled to an output terminal of the circuitry. The first switch has a first voltage source terminal which is connectible to a voltage source having a first voltage level. The second switch has a first voltage source terminal which is connectible to a voltage source having a second voltage level which is greater in magnitude that the first voltage level, and further has a reference voltage source terminal which is connectible to a reference voltage source which is lesser in magnitude than the first voltage level. The first switch is adapted to selectively couple the first voltage source terminal thereof to the circuitry output terminal. The second switch is adapted to selectively couple the first voltage source terminal thereof to the circuitry output terminal and also to selectively couple the reference voltage source terminal thereof to the circuitry output terminal.

In accordance with one aspect of the invention, a CCD clock driver circuit comprises a first charging path connected between a first voltage source and the capacitive load under the control of the clock signal, a second source of a voltage higher than the voltage of the first source, and a second charging path connected between the second voltage source and the load under the control of the clock signal, both charging paths operating together to charge the load to a first voltage level and the second charging path operating substantially alone to charge the load to a second higher voltage level. Voltage limitations of the first charging path are thus overcome. Both charging paths may, in accordance with another aspect of the invention, be implemented by semiconductor switches which are widely available and fully capable of operating at very high clock frequencies.

In accordance with yet another aspect of the invention, the first and second charging paths are provided, respectively, by single pole double throw and single pole single throw semiconductor switches, both operated under the control of the clock signal. The double throw switch connects the CCD load alternately between the first voltage source and a reference voltage, thereby providing not only a charging path but also a discharge path for the load during the intervals between clock pulses. In accordance with a further aspect of the invention, the output impedance of the first charging path is less than that of the second charging path, so that the voltage at the capacitive load rises most rapidly during the initial portion of the charging cycle, when the load is being charged from both paths simultaneously.

From another point of view, the first charging path in a CCD clock driver embodying the invention takes the form of a relatively low voltage high current and relatively low output impedance semiconductor switch, while the second charging path takes the form of a higher voltage and lower current semiconductor switch. In embodiments of the invention in which the high voltage switch has a greater propagation delay than the low voltage switch, a compensating delay is included in series with the latter in the first charging path.

The invention will be better understood from the following more detailed explanation, taken in the light of the accompanying drawing and appended claims.

DETAILED DESCRIPTION

Figure 1:
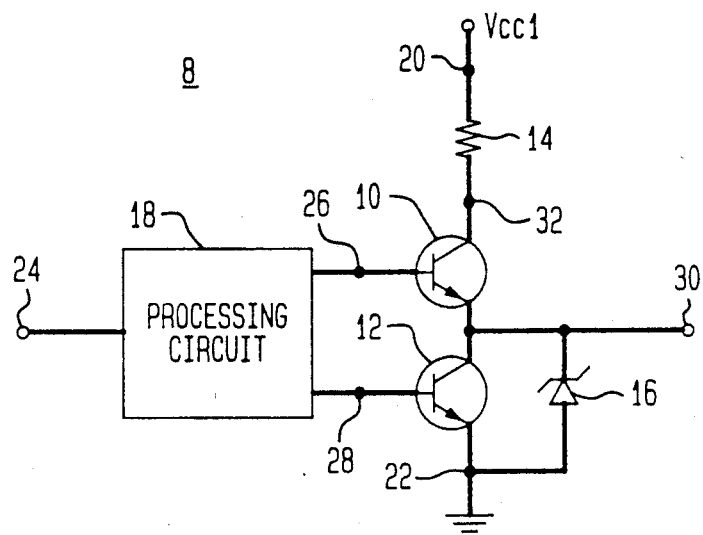
FIG. 1 is an illustration of a semiconductor inverter serving as a single pole double throw switch suitable for use in embodiments of the invention.

Referring now to FIG. 1, there is shown an inverter 8 which is described in the previously discussed U.S. Pat. No. 4,761,565 and includes first and second n-p-n transistors 10 and 12, a resistor 14, a Schottky barrier diode 16 and a processing circuit 18. An inverter input terminal 24 is coupled to an input of processing circuit 18 and an inverter output terminal 30 is coupled to the emitter of transistor 10, to the collector of transistor 12 and to an cathode of diode 16. First 26 and second 28 complementary output terminals of processing circuit 18 are coupled to the bases of transistors 10 and 12, respectively. A first terminal of resistor 14 is coupled to a positive voltage source Vcc1 and to a terminal 20. A second terminal of resistor 14 is coupled to the collector of transistor 10 and to a terminal 32. The emitter of transistor 12 is coupled to the anode of diode 16, to a terminal 22 and to a reference voltage which is shown as ground potential (zero volts).

In operation, processing circuit 18 generates complementary output signals at output terminals 26 and 28 which cause transistor 10 to be biased on and transistor 12 to be biased off or vice versa. With transistor 10 biased on and transistor 12 biased off, output terminal 30 is charged (pulled up) to a voltage at or near that of Vcc1. With transistor 12 biased on and transistor 10 biased off, output terminal 30 is discharged (pulled down) in voltage to a level at or near ground potential (zero volts). A high "1" input signal applied to input terminal 24 causes processing circuit 18 to generate a low, a "0", at output terminal 26 and a "1" at output terminal 28. This combination biases on transistor 12 and biases off transistor 10. Thus output terminal 30 is pulled down to a level at or near zero volts which is defined as an output "0". If the input signal applied to input terminal 24 is a "0", then terminals 26 and 28 become a "1" and a "0", respectively. This biases on transistor 10 and biases off transistor 12 which results in output terminal 30 being set to a level at or near Vcc1, which is defined as an output "1". Inverter 8 thus acts as a single pole double throw inverting semiconductor switch.

When the inverter 8 is used to drive a capacitive load (not shown) coupled to output terminal 30, the double throw nature of the semiconductor switch is important because transistor 10 provides a charging path for the capacitive load and transistor 12 provides a discharge path for the capacitive load.

An example of a commercially available semiconductor inverter of the type shown in FIG. 1 is Fairchild's advanced Schottky Chip Model 74F04, which is actually a set of six inverter circuits on a single integrated circuit chip referred to in the art as a hex inverter. Each inverter circuit within the set contains at least two switching transistors like transistors 10 and 12 of FIG. 1.

Figure 2:
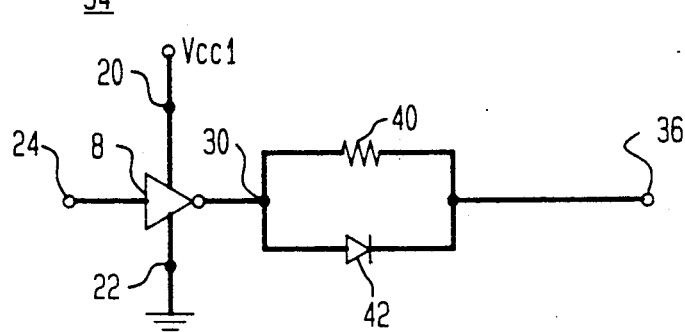
FIG. 2 illustrates the manner in which additional short circuit protection may be provided for the inverter shown in FIG. 1.

Referring now to FIG. 2, there is shown an inverter combination 34 which shows how additional short circuit protection may be provided for inverter circuit 8 of FIG. 1 and is in accordance with further teaching of U.S. Pat. No. 4,761,565. Inverter combination 34 comprises an inverter circuit 8, like inverter circuit 8 of FIG. 1, a resistor 40 and a diode 42. The anode of diode 42 is connected to the output of inverter 8, to the terminal 30 and to a first terminal of resistor 40. The cathode of diode 42 is coupled to a second terminal of resistor 40 and to an output terminal 36 of inverter combination 34. Diode 42 acts as a unidirectional rectifier which permits current from inverter combination 34 to charge a load element (not shown) coupled to output terminal 36, but does not permit current flow in the reverse direction. Resistor 40 permits current flow in either direction therethrough. Resistor 40 provides short circuit protection for transistor 12 (see FIG. 1) of inverter 8 when a capacitive load (not shown) coupled to output terminal 36 is discharging and also serves to reduce the Q factor of the printed circuit connection, which can be quite significant in the 30 megahertz frequency range. Inverter combination 34 functions essentially as a single pole double throw switch.

U.S. Pat. No. 4,761,565 also teaches how multiple single pole double throw semiconductor switches like the inverter combination 34 can be placed in parallel with one another in increase the amount of current supplied to a capacitive load. This object is easily achieved at very high frequencies as long as the load does not need to be charged to a voltage more than about five or six volts. Readily available inverters of this type are limited, however, to that voltage range. Developing a new high frequency inverter for higher voltages would be expensive and the resulting inverter could easily present significant power dissipation problems.

Figure 3:
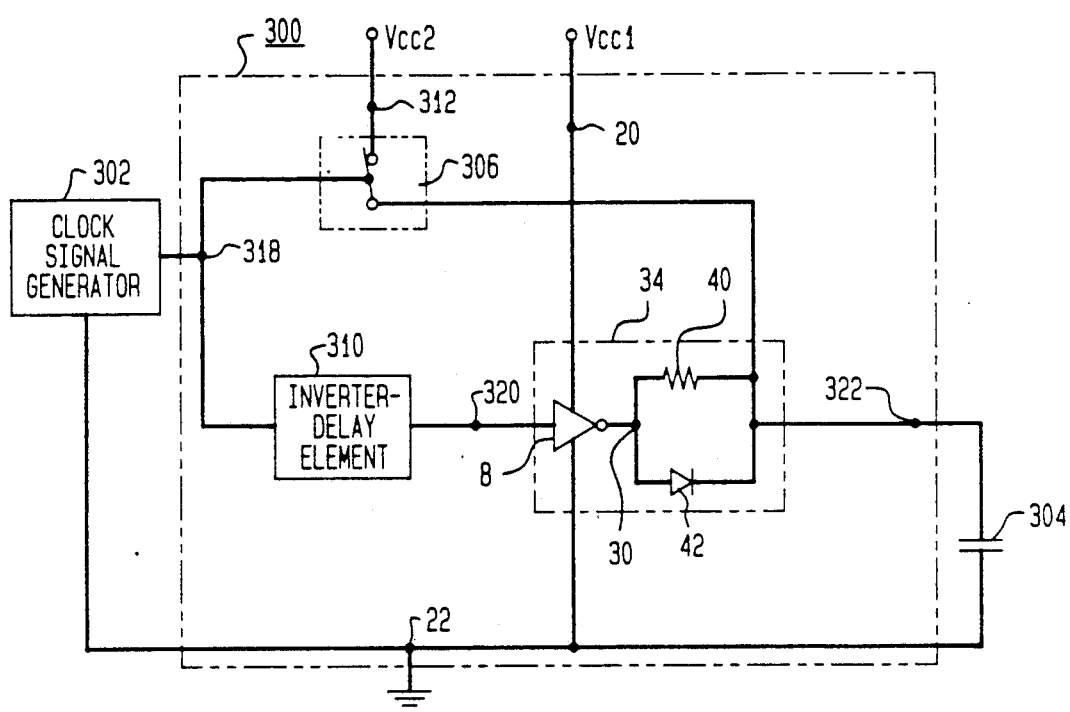
FIG. 3 is a block diagram of an embodiment in accordance with the present invention.

Referring now to FIG. 3, there is shown within a first dashed line rectangle a driver circuit 300 in accordance with the present invention. Driver circuit 300 has an input terminal 318 which is coupled to an output terminal of a clock signal generator 302. Clock signal generator 302 has a ground terminal which is coupled to a terminal 22 which is coupled to a reference voltage that is shown as ground potential (zero volts). An output terminal 322 of circuit 300 is coupled to a first terminal of a capacitor (load element) 304 which has a second terminal coupled to terminal 22. Circuit 300 comprises a switch 306, an inverter combination 34 (shown within a dashed line rectangle) and an inverter-delay element 310. Inverter-delay element 310 has an input coupled to the input terminal 318 and has an output coupled to an input of inverter combination 34 and to a terminal 320. Inverter combination 34, which is essentially identical to inverter combination 34 of FIG. 2, has a first voltage terminal which is coupled to a terminal 20 and to a positive voltage source Vcc1 and has a second voltage terminal which is coupled to a terminal 22 which is coupled to ground potential (zero volts). An output of inverter 8 is coupled to a first terminal of resistor 40, to the anode of diode 42 and to a terminal 30. A second terminal of resistor 40 and the cathode of diode 42 are coupled to the output terminal 322.

Switch 306 is shown as a single pole single throw type switch. It has a first terminal coupled to a terminal 312 and to a positive voltage source Vcc2, a second terminal coupled to the output terminal 322 and a control arm (input) which is coupled to an input terminal 318. Vcc2 has a greater magnitude that Vcc1. Switch 306 is designed to operate to allow output terminal 322 to be charged (pulled up) to a voltage level at or near that of Vcc2. Inverter combination 34 is designed to selectively and relatively rapidly charge output terminal 322 to a level at or near that of Vcc1 and is also designed to selectively and relatively rapidly discharge the voltage level of output terminal 322 from a level at or close to Vcc2 to a level at or near zero volts.

Circuit 300 operates as follows: Assuming that the output of clock generator 302 switches from a "0" to a "1". Switch 306, which is shown in the closed position (corresponding to a "1" input signal being applied to the control arm thereof) acts as essentially a short circuit between output terminal 322 and terminal 312. Thus output terminal 322 starts to charge (be pulled up) in voltage towards the level of Vcc2 with switch 306 acting as a first charging path. Inverter combination 34, after an inversion and delay introduced by inverter-delay element 310, causes output terminal 322 to charge towards Vcc1. Thus, inverter combination 34 acts a second charging path. In some cases inverter combination 34 responds faster than switch 306. Inverter-delay element 310 is used in these cases to cause inverter combination 34 to begin to pull up the voltage of output terminal 322 at essentially the same time as switch 306 is doing so. In addition, it provides an inversion which when combined with the inversion provided by inverter combination 34, results in driver circuit 300 being a non-inverting buffer type driver. Once output terminal 322 reaches a voltage level at or near Vcc1, inverter combination 34 ceases to pull up output terminal 322 any further in voltage. Switch 306 continues to pull up the voltage of terminal 322 until it reaches a voltage level at or near Vcc2 which is defined as an output "1".

After output terminal 322 reaches a voltage level at or near that of Vcc2, a "1", the output of clock signal generator 302 switches from a "1" to a "0". This causes switch 306 to open (i.e., the control arm causes terminal 312 to be disconnected from output terminal 322). This isolates Vcc2 from output terminal 322. In addition, after the inversion and delay introduced by inverter-delay element 310, it causes inverter combination 34 to open the charging path between Vcc1 and output terminal 322 and to close a discharge path between output terminal 322 and terminal 22 and ground. This causes output terminal 322 to be pulled down in voltage to a level at or close to ground, an output "0".

Accordingly, switch 306, which may be denoted as an analog switch, and inverter combination 34 both serve to selectively pull up output terminal 322 to a voltage level at or close to Vcc1. Then switch 306, acting by itself, continues to pull up the voltage of terminal 322 until it reaches a level at or close to that of Vcc2. Thereafter, switch 306 opens up (electrically isolates Vcc2 from output terminal 322) and inverter combination 34 pulls down the voltage of output terminal 322 until it reaches a level which is at or near zero volts.

In driver circuit 300, inverter combination 34 serves as a relatively low voltage high current single pole double throw switch. It functions as a first charging path which relatively quickly charges output terminal 322 to a voltage level at or near that of Vcc1. In addition, it provides a necessary discharge path to quickly discharge output terminal 322 from its final voltage level at or near Vcc2 back to ground. Single pole single throw switch 306 serves as a second charging path which is characterized by a higher voltage capability and lower charging current than inverter combination 34. The second charging path facilitates output terminal 322 being charged to its high level, at or near Vcc2. The output impedance of the first charging path is lower than that of the second charging path. The voltage of output terminal 322 thus increases more rapidly during the initial portion of the charging operation when current is being predominantly via the first charging path. Switch 306 is capable of charging output terminal 322 from Vcc1 to Vcc2 with sufficiently quickly to be useful in many applications.

Figure 4:
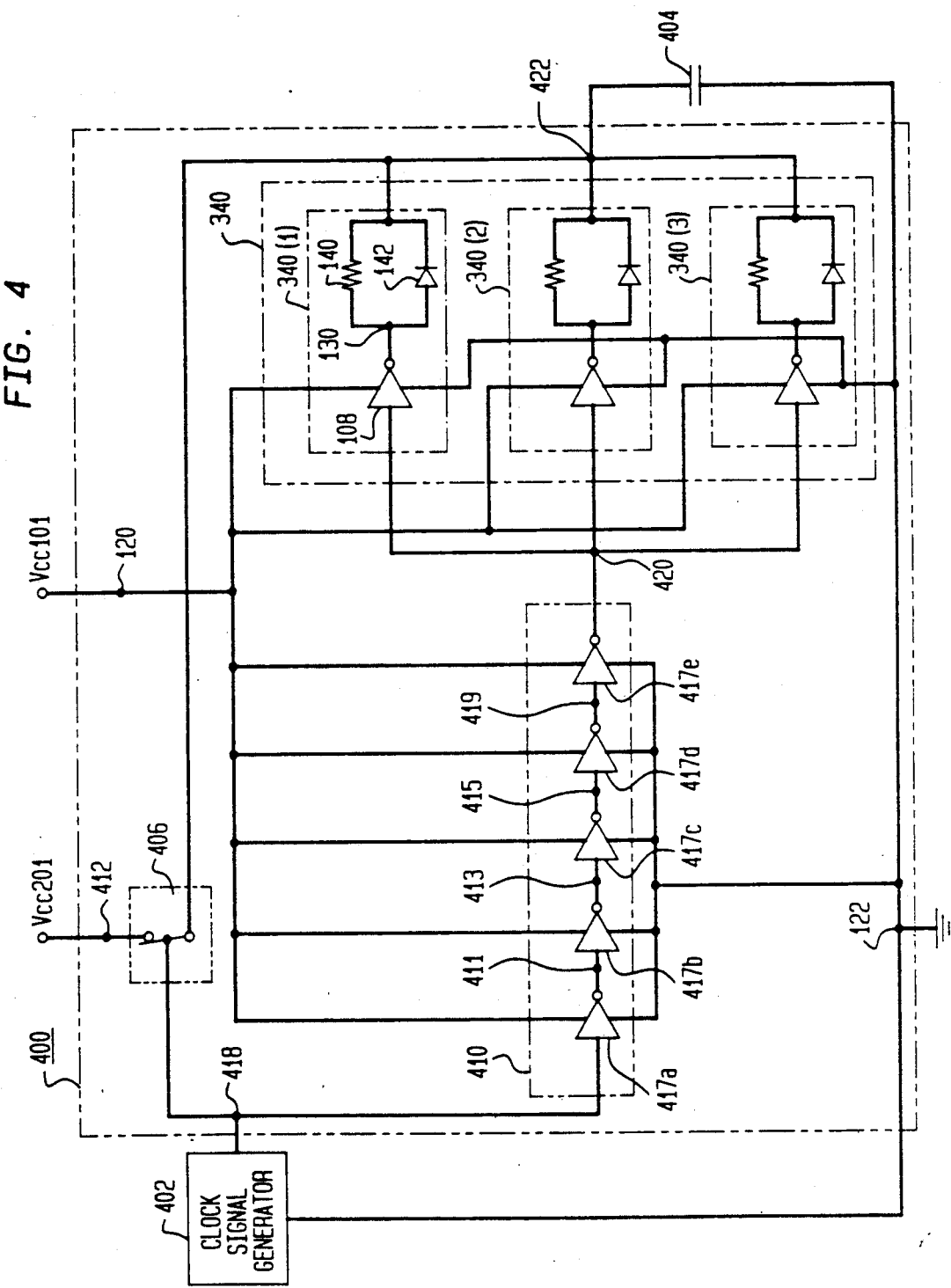
FIG. 4 is a block and schematic diagram of another embodiment in accordance with the present invention.

Referring now to FIG. 4, there is shown within a first dashed line rectangle a driver circuit 400 in accordance with a more specific embodiment of the present invention. Circuit 400 is similar to and operates in essentially the same way as circuit 300 of FIG. 3 and corresponding components and terminals have the same number with 100 added thereto. Circuit 400 comprises a switch 406, an inverter-delay element 410 (shown within a dashed line rectangle) comprising inverters 417a, 417b, 417c, 417d and 417e, and an inverter combination 340 comprising three essentially identical inverter sections 340(1), 340(2) and 340(3). Inverter sections 340(1), 340(2) and 340(3) are each essentially the same as the inverter combination 34 of FIG. 2 and each comprise and an inverter 108, a resistor 140 and a diode 142. Clock signal generator 402, which has an output coupled to an input terminal 418 of circuit 400 and is coupled to a terminal 122 that is coupled to ground, controls circuit 400 and thus controls the charging and discharging of a capacitor 404 coupled to an output terminal 422 of circuit 400.

The input terminal 418 is coupled to an input of inverter 417a. An output of inverter 417a is coupled to an input of inverter 417b and to a terminal 411. An output of inverter 417b is coupled to an input of inverter 417c and to a terminal 413. An output of inverter 417c is coupled to an input of inverter 417d and to a terminal 415. An output of inverter 417d is coupled to an input of inverter 417e and to a terminal 419. An output of inverter 417e is coupled to an inputs of inverters 108 and to a terminal 420. An output of each inverter 108 is coupled to a first terminal of the resistor 140, to the anode of diode 142 and to a terminal 130. A second terminal of the resistor 140 and the anode of diode 142 are coupled to the output terminal 422. A first terminal of switch 406 is coupled to a terminal 412 and to a positive voltage source Vcc201. A second terminal of switch 406 is coupled to output terminal 422. A control (input) terminal of switch 406 is coupled to the input terminal 418. First power supply terminals of inverters 417a, 417b, 417c, 417d, 417e and inverters 108 are coupled to a terminal 120 and to a positive voltage source Vcc101. Second power supply terminals of these inverters are coupled to a terminal 122 and to a reference voltage which is shown as ground (zero volts).

The combination of inverter-delay element 410 and inverter combination 340 serves as a first charging means and a discharging means that facilitates the charging of capacitor 404 via a first charging path from +Vcc101 through inverters 108, resistors 140 and diodes 142 to output terminal 422 from zero volts (ground) to +Vcc101 and the discharging of capacitor 404 through inverters 108 and resistors 140 to terminal 122 and ground. Switch 406 serves as a second charging means that facilitates the charging of capacitor 404 via a second charging path from Vcc2 through switch 406 to output terminal 422. The magnitude of Vcc201 is greater than that of Vcc101.

In an illustrative embodiment, switch 406 is an MM54HC4066 analog switch manufactured by National Semiconductor, inverters 417a, 417b, 417c, 417d, 417e and 108 are each an inverter of a 74F04 manufactured by Fairchild (now a part of National Semiconductor), resistors 140 are 43 ohms each, Vcc101 = +6 volts and Vcc201 = +12 volts. The voltages appearing at output terminal 422 swing from ground to about +10 volts. The illustrative switch 406 has a voltage limitation of about +12 volts and the illustrative inverters 108 have a voltage limitation of about +6 volts. In this illustrative embodiment power dissipation is relatively low and no external cooling is required. All components used are low cost, off the shelf items.

Inverters 108 and switch 406 act together to charge capacitor 404 to about +6 volts. When the capacitor 404 (output terminal 422) reaches +6 volts, then the switch 406 continues to charge capacitor 404 until it reaches a voltage level at or near +12 volts (typically about +10 volts). Because the internal resistance of the illustrative analog switch 406 is larger than that of the first charging path through inverters 108, the second charging path through switch 406 has the longer time constant. The internal resistance of analog switch 406 is, moreover, sufficient to provide adequate short circuit protection.

Analog single pole single throw switch 406 does, however, have more propagation delay than the single pole double throw switches represented by inverters 108. Although inverters 108 turn on in response to a high clock voltage level in about three nanoseconds, it takes switch 406 approximately twelve nanoseconds to turn on. In accordance with a feature of the invention, this propagation delay difference is compensated for by including the five additional inverters 417a, 417b, 417c, 417d and 417e in tandem (series) between input terminal 418 and a terminal 420 of the input sides of inverters 108. The inverters 108 are thus made to turn on substantially simultaneously with analog switch 406. Although analog single pole single throw switch 406 provides no discharge path for capacitor 404, no additional discharge path is necessary in view of that provided by inverter double throw inverters 108.

Inverter combination 340 and switch 406 have essentially the same relative characteristics as inverter combination 34 and switch 306, respectively, of driver circuit 300 of FIG. 3.

It is to be understood that the embodiment of the invention which has been described is illustrative. Modifications may readily be devised by those skilled in the art without departing from the spirit and scope of the invention. For example, inverters 8 and 108 can have either Schottky barrier transistors, CMOS transistors, or both may be employed. Still further, the transistors of inverter 8 can be of the opposite conductivity type as shown or could be a complementary pair of CMOs transistors provided the control circuit and voltage polarities are modified appropriately. Furthermore, inverter combination 340 can have more or less than three parallel inverter sections. As the current drive capability of circuit 400 increases, the number of inverter sections is likewise increased. Still further, switch 406 can be modified to be a single pole double throw switch which does have a discharge capability. Still further, circuitries 300 and 400 can be driven by a variety of circuits other than a clock signal generator.

What is claimed is:

1. A clock drive circuit for charging a CCD capacitive load in response to a clock signal of a predetermined voltage amplitude, said clock drive circuit comprising:
   an input terminal for receiving said clock signal;
   an output terminal for supplying current to said capacitive load;
   a first voltage terminal for receiving a first voltage;
   a second voltage terminal for receiving a second voltage greater than said first voltage;
   a first charging path selectively connected between said first voltage terminal and said output terminal under the control of said clock signal; and
   a second charging path having a substantially higher impedance than said first charging path selectively connected between said second voltage terminal and said output terminal under the control of said clock signal;
   both of said charging paths operating together to charge said capacitive load to said first voltage level and said second charging path operating substantially alone to charge said capacitive load from said first voltage level to said second voltage level greater than said first voltage level greater than said first voltage level.

2. A clock drive circuit for charging a CCD capacitive load in response to a clock signal of a predetermined voltage amplitude, said clock drive circuit comprising:
   an input terminal for receiving said clock signal;
   an output terminal supplying current to said capacitive load;
   a first voltage terminal for receiving a first voltage;
   a second voltage terminal for receiving a second voltage greater than said first voltage;
   a reference terminal for receiving a reference potential;
   a first charging path selectively connected between said first voltage terminal and said output terminal under the control of said clock signal;
   a discharge path selectively connected between said reference terminal and said output terminal under the control of said clock signal in alternation with the connection of said first charging path between said first voltage terminal and said output terminal; and
   a second charging path having a substantially higher impedance than said first charging path selectively connected between said second voltage terminal and said output terminal the control of said clock signal;
   both of said charging paths operating together to charge said capacitive load to said first voltage level and said second charging path operating substantially alone to charge said capacitive load from said first voltage level to said second voltage level greater than said first voltage level.

3. A clock drive circuit for charging a CCD capacitive load in response to a clock signal of a predetermined voltage amplitude, said clock drive circuit comprising:
   an input terminal for receiving said clock signal;
   an output terminal for supplying current to said capacitive load;
   a first voltage terminal for receiving a first voltage;
   a second voltage terminal for receiving a second voltage greater than said first voltage;
   a low voltage and high current switch selectively connected between said first voltage terminal and said output terminal under the control of said clock signal; and
   a high voltage and low current switch selectively connected between said second voltage terminal and said output terminal under the control of said clock signal;
   both of said switches operating together to charge said capacitive load to said first voltage level and said high voltage and low current switch operating substantially alone to charge said capacitive load from said first voltage level to said second voltage level greater than said first voltage level.

4. A clock drive circuit for charging a CCD capacitive load in response to a clock signal of a predetermined voltage amplitude, said clock drive circuit comprising:
   an input terminal for receiving said clock signal;
   an output terminal for supplying current to said capacitive load;
   a first voltage terminal for receiving a first voltage;

a second voltage terminal for receiving a second voltage greater than said first voltage;

a low voltage and high current switch selectively connected between said first voltage terminal and said output terminal under the control of said clock signal, said low voltage and high current switch also providing a discharge path for said capacitive load connected to said output terminal; and a high voltage and low current switch selectively connected between said second voltage terminal and said output terminal under the control of said clock signal;

both of said charging paths operating together to charge said capacitive load to said first voltage level and said second charging path operating substantially alone to charge said capacitive load from said first voltage level to said second voltage level greater than said first voltage level.

5. A clock drive circuit for charging a CCD capacitive load in response to a clock signal of a predetermined voltage amplitude, said clock drive circuit comprising:

an input terminal for receiving said clock signal;

an output terminal for supplying current to said capacitive load;

a first voltage terminal for receiving a first voltage;

a second voltage terminal for receiving a second voltage greater than said first voltage;

a low voltage and high current switch selectively connected between said first voltage terminal and said output terminal under the control of said clock signal, said low voltage high current switch also providing a discharge path for said capacitive load connected to said output terminal;

a high voltage and low current switch selectively connected between said second voltage terminal and said output terminal under the control of said clock signal, said high voltage and low current switch having a propagation delay greater than that of said low voltage and high current switch;

both of said switches operating together to charge said capacitive load to said first voltage level and said high voltage and low current switch operating substantially alone to charge said capacitive load from said first voltage level to said second voltage level greater than said first voltage level;

compensating delay substantially matching the propagation delay of said high voltage and low current switch connected in series between said input terminal and said low voltage and high current switch.

* * * * *